US010227232B2

(12) United States Patent
Lim et al.

(10) Patent No.: US 10,227,232 B2
(45) Date of Patent: Mar. 12, 2019

(54) MICROELECTROMECHANICAL SYSTEM (MEMS) DEVICE PACKAGING

(71) Applicant: Knowles Electronics, LLC, Itasca, IL (US)

(72) Inventors: Tony K. Lim, Naperville, IL (US); Norman D. Talag, Woodridge, IL (US)

(73) Assignee: Knowles Electronics, LLC, Itasca, IL (US)

( * ) Notice: Subject to any disclaimer, the term of this patent is extended or adjusted under 35 U.S.C. 154(b) by 3 days.

(21) Appl. No.: 15/660,543

(22) Filed: Jul. 26, 2017

(65) Prior Publication Data

US 2018/0029880 A1    Feb. 1, 2018

Related U.S. Application Data

(60) Provisional application No. 62/367,531, filed on Jul. 27, 2016.

(51) Int. Cl.

| H04R 3/00 | (2006.01) |
|---|---|
| B81C 1/00 | (2006.01) |
| B81B 7/00 | (2006.01) |
| H04R 19/01 | (2006.01) |
| H04R 19/00 | (2006.01) |
| H04R 31/00 | (2006.01) |

(52) U.S. Cl.
CPC ............ *B81C 1/0023* (2013.01); *B81B 7/007* (2013.01); *B81C 1/00269* (2013.01); *H04R 19/005* (2013.01); *H04R 19/016* (2013.01); *H04R 31/006* (2013.01); *B81B 2201/0257* (2013.01); *B81B 2207/095* (2013.01); *B81B 2207/096* (2013.01); *B81C 2203/019* (2013.01); *H04R 2201/003* (2013.01)

(58) Field of Classification Search
USPC ... 381/122, 174, 91, 357, 175, 176, 372, 92, 381/112, 113, 114
See application file for complete search history.

(56) References Cited

U.S. PATENT DOCUMENTS

| 7,190,038 B2 | 3/2007 | Dehe et al. |
|---|---|---|
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |

(Continued)

OTHER PUBLICATIONS

International Search Report and Written Opinion, PCT/US2017/043981, Knowles Electronics, LLC, 9 pages (dated Nov. 6, 2017).

*Primary Examiner* — Yosef K Laekemariam
(74) *Attorney, Agent, or Firm* — Foley & Lardner LLP

(57) ABSTRACT

Systems, apparatuses, and methods for manufacturing a microelectromechanical system (MEMS) device. The MEMS device includes a substrate, a cap, a microelectromechanical component, and a tag. The substrate defines a port. The cap is coupled to the substrate. The substrate and the cap cooperatively define an interior cavity. The microelectromechanical component is disposed within the interior cavity and coupled to the substrate such that the microelectromechanical component is positioned over the port to at least partially isolate the port from the interior cavity. The tag is coupled to the substrate and the cap. The tag is positioned to secure the cap to the substrate.

20 Claims, 7 Drawing Sheets

(56) References Cited

U.S. PATENT DOCUMENTS

| | | |
|---|---|---|
| 7,829,961 B2 | 11/2010 | Hsiao |
| 7,856,804 B2 | 12/2010 | Laming et al. |
| 7,903,831 B2 | 3/2011 | Song |
| 2005/0207605 A1 | 9/2005 | Dehe et al. |
| 2007/0057602 A1* | 3/2007 | Song ................ H04R 19/04 310/328 |
| 2007/0278501 A1 | 12/2007 | MacPherson et al. |
| 2008/0175425 A1* | 7/2008 | Roberts ............ B81C 1/00269 381/361 |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2015/0166335 A1* | 6/2015 | Loeppert ........... B81C 1/00888 438/51 |

* cited by examiner

MICROELECTROMECHANICAL SYSTEM (MEMS) DEVICE PACKAGING

CROSS-REFERENCE TO RELATED PATENT APPLICATIONS

This application claims the benefit of U.S. Provisional Patent Application No. 62/367,531, filed Jul. 27, 2016, which is incorporated herein by reference in its entirety.

BACKGROUND

The following description is provided to assist the understanding of the reader. None of the information provided or references cited is admitted to be prior art.

Compact components are desirable when building high-performance, high-density devices such as cell phones, digital still cameras, portable music players, and other portable electronic devices. One solution for providing high quality, compact devices is to use microelectromechanical systems (MEMS).

One exemplary MEMS device is a MEMS microphone device that can advantageously be used with a mobile phone or other device. MEMS microphone devices typically include a printed circuit board (PCB), a microphone, and a lid or can that covers and encapsulates the microphone. One of the process steps in assembling such a MEMS microphone device requires the MEMS microphone device to be heated up with the can attached to the PCB. During this step, an acoustic seal is formed within a back-cavity of a bottom-port microphone resulting in the potential build-up of pressure within the can when flux and/or solvents evaporate during the heating cycle. If sufficient pressure is built up, the can may tilt, rotate, and/or shift and form a geometrically defective MEMS microphone device.

SUMMARY

In general, one aspect of the subject matter described in this specification can be embodied as a microelectromechanical system (MEMS) device. The MEMS device includes a substrate, a cap, a microelectromechanical component, and a tag. The substrate defines a port. The cap is coupled to the substrate. The substrate and the cap cooperatively define an interior cavity. The microelectromechanical component is disposed within the interior cavity and coupled to the substrate such that the microelectromechanical component is positioned over the port to at least partially isolate the port from the interior cavity. The tag is coupled to the substrate and the cap. The tag is positioned to secure the cap to the substrate.

In general, another aspect of the subject matter described in this specification can be embodied in a method for manufacturing a microelectromechanical system (MEMS) device. The method includes providing a substrate blank defining a plurality of apertures; coupling a plurality of guard rings to the substrate blank such that each of the plurality of guard rings is positioned to surround a respective one of the plurality of apertures, where each of the plurality of guard rings defines at least one of a vent or a semi-cutout; coupling a plurality of microelectromechanical components to the substrate blank, each of the plurality of microelectromechanical components positioned within a periphery of a respective guard ring and at least partially isolating a respective one of the plurality of apertures; coupling a plurality of caps onto the plurality of guard rings, each of the plurality of caps coupled to a respective one of the plurality of guard rings; applying a plurality of tags to seal each vent or semi-cutout and secure each set of guard rings and caps to the substrate blank; and singulating each set of guard rings and caps from the substrate blank to form a plurality of individual MEMS devices.

In general, another aspect of the subject matter described in this specification can be embodied in a populated printed-circuit-board (PCB) blank. The PCB blank includes a substrate blank defining a plurality of substrate apertures, a plurality of microelectromechanical devices, and a plurality of tags. The plurality of microelectromechanical devices are positioned on the substrate blank. Each of the plurality of microelectromechanical devices includes a guard ring, a lid, and a microelectromechanical component. The guard ring is coupled to the substrate blank. The guard ring has a first edge and an opposing second edge defining at least one of a vent aperture or a semi-cutout. The lid is coupled to the guard ring. The substrate blank, the guard ring, and the lid cooperatively define an interior cavity. The microelectromechanical component is coupled to the substrate blank over a respective substrate aperture to at least partially isolate the respective substrate aperture from the interior cavity. Each of the plurality of tags is positioned between adjacent microelectromechanical devices such that (i) the first edge and the second edge of each guard ring is secured to the substrate blank (ii) and each of the at least one of the vent aperture or the semi-cutout is sealed.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figure 1:
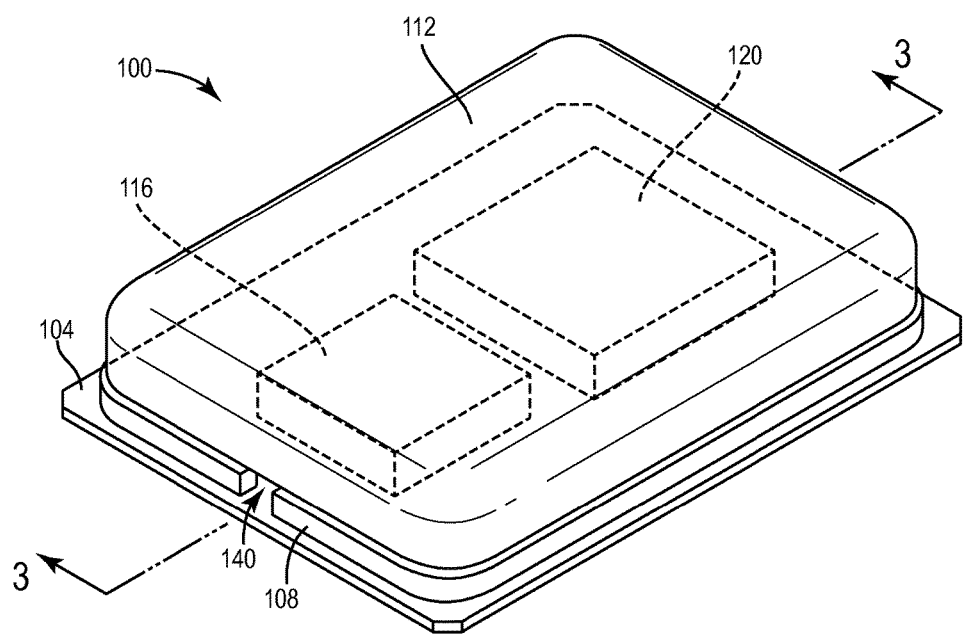
FIG. 1 is a perspective view of a MEMS device in accordance with various implementations.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

According to an exemplary embodiment, a MEMS device (e.g., for a smartphone, a tablet, a laptop, a smart watch, a hearing aid, a video camera, a communications device, etc.) includes a substrate (e.g., a base, a PCB, etc.), a microphone, a guard ring, and a can. In one embodiment, the guard ring, or alternatively a portion of the can, includes an aperture, cutout, or vent. In other embodiments, the guard ring, or alternatively a portion of the can, includes a notch or semi-cutout. During production, the microphone, the guard ring, and/or the can are soldered or otherwise coupled to the substrate. After the microphone, the guard ring, and/or the can are coupled together, a non-meltable adhesive or sealant in the form of an epoxy or another non-meltable material may be applied between the substrate, the guard ring, and the can to effectively seal the aperture and isolate the microphone within the can.

The epoxy and/or another non-meltable material may advantageously have a melting point higher than the solder used to couple the can and/or the guard ring to the substrate such that the epoxy or another non-meltable material does not melt upon reflow. As a result, when the MEMS device is subsequently reflowed during integration or installation into a larger device (e.g., for a smartphone, a tablet, a laptop, a smart watch, a hearing aid, a video camera, a communications device, etc.), the epoxy or another non-meltable material maintains the can and/or the guard ring in position and does not allow the can and/or the guard ring to tilt, rotate, shift, or otherwise deform during the heating cycle.

According to the exemplary embodiment shown in FIGS. 1-7, a MEMS device, shown as a MEMS device 100, includes a substrate, shown as printed circuit board (PCB) 104; a ring or boundary, shown as guard ring 108; a cap, cover, or lid, shown as can 112; a circuit or processor, shown as application-specific integrated circuit (ASIC) 116; and a microelectromechanical component (e.g., a transducer, a motor, a microphone component, etc.), shown as MEMS microphone 120.

Figure 2A:
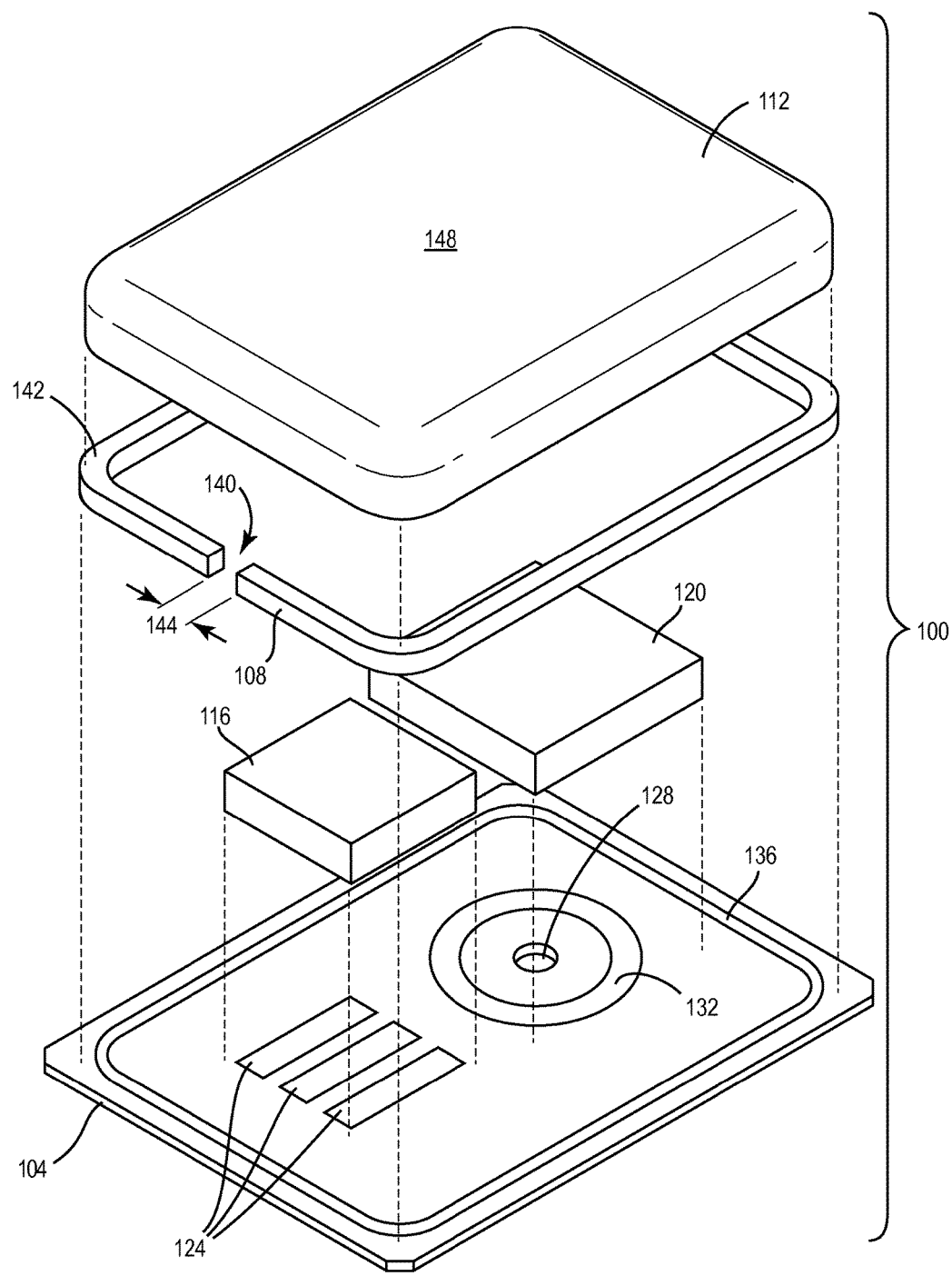
FIG. 2A is an exploded view of the MEMS device of FIG. 1 having a guard ring defining an aperture in accordance with various implementations.
Figure 2B:
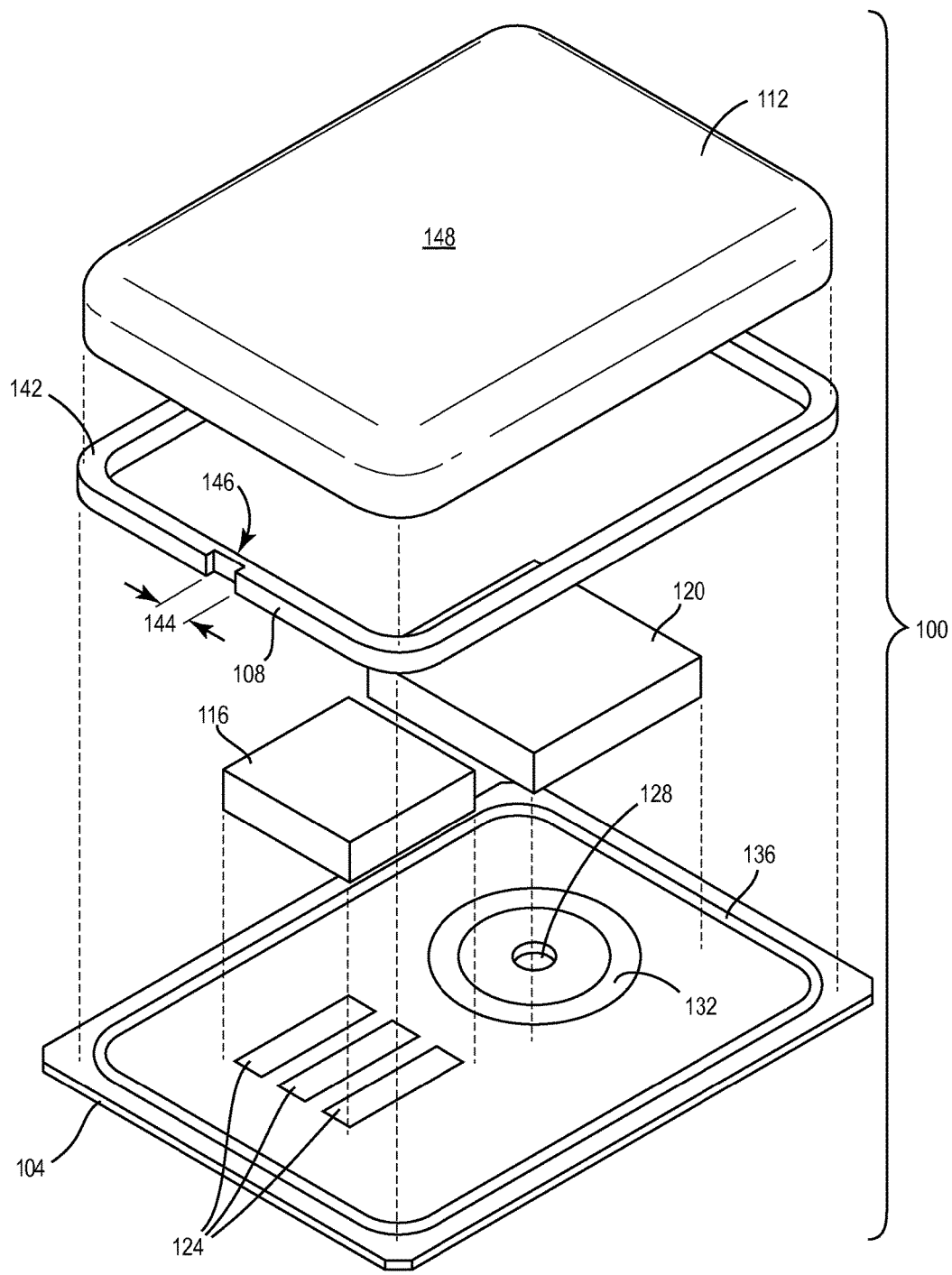
FIG. 2B is an exploded view of the MEMS device of FIG. 1 having a guard ring defining a semi-cutout in accordance with various implementations.

According to an exemplary embodiment, the PCB 104 includes conductive traces surrounded and/or embedded in non-conductive substrate material and may be formed in sheets, strips, or individual boards as desired. In some embodiments, the PCB 104 includes a solder mask layer, a metal layer, and/or an inner PCMB layer (e.g., manufactured from FR-4 material, etc.). As shown in FIGS. 2A and 2B, the PCB 104 includes one of more circuit traces or pads, shown as ASIC traces 124; a substrate aperture, shown as port 128, that extends through the PCB 104 and provides fluid communication therethrough; a component trace or pad, shown as microphone trace 132, that is substantially annular and surrounds the port 128; and a periphery trace or pad, shown as guard ring trace 136, that surrounds or encompasses the ASIC traces 124, the port 128, and the microphone trace 132. The PCB 104 may include other features, traces or pads, and/or may include embedded components.

According to an exemplary embodiment, the ASIC traces 124 are configured (e.g., arranged, positioned, etc.) to couple the ASIC 116 to the PCB 104. In some embodiments, the ASIC traces 124 are configured to receive flux and/or solder (e.g., a remeltable conductive metal alloy, lead free solder, etc.) to electrically couple the ASIC 116 to the PCB 104. In other embodiments, the ASIC traces 124 include depressions or locations on the PCB 104 configured to receive adhesive and/or another coupling mechanism. The layout and/or configuration of the ASIC traces 124 may be different and arranged to suit the particular ASIC 116 employed in the MEMS device 100. By way of example, the PCB 104 may include more than or less than three ASIC traces 124 (e.g., one, two, four, five, etc.). In other embodiments, the PCB 104 does not include the ASIC traces 124.

As shown in FIGS. 2A and 2B, the port 128 is a substantially round through-hole defined by (e.g., formed through, etc.) the PCB 104. The port 128 may facilitate communication (e.g., audible communication, etc.) between the MEMS microphone 120 and an ambient environment (e.g., the MEMS microphone 120 receives acoustic energy through the port 128, etc.). According to the exemplary embodiment shown in FIGS. 2A and 2B, the MEMS device 100 is a bottom-port MEMs device (i.e., the PCB 104 defines the port 128). In other embodiments, the port 128 has a different shape, has a different diameter, and/or is otherwise positioned on the PCB 104. In an alternative embodiment, the MEMS device 100 is a top-port MEMS device (e.g., the can 112 defines the port 128, etc.).

According to an exemplary embodiment, the microphone trace 132 is configured (e.g., arranged, positioned, etc.) to couple the MEMS microphone 120 to the PCB 104. In some embodiments, the microphone trace 132 is configured to receive flux and/and solder to electrically couple the MEMS microphone 120 to the PCB 104. In other embodiments, the microphone trace 132 includes depressions or locations on the PCB 104 configured to receive adhesive and/or another coupling mechanism. The layout and/or configuration of the microphone trace 132 may be different and arranged to suit the particular MEMS microphone 120 employed in the MEMS device 100. By way of example, the microphone trace 132 may have a different shape and/or a different diameter. In other embodiments, the PCB 104 does not include the microphone trace 132.

As shown in FIGS. 2A and 2B, the guard ring trace 136 substantially surrounds the ASIC traces 124, the port 128, and the microphone trace 132 (e.g., the guard ring trace 136 extends along and/or around at least a portion of the periphery of the PCB 104, etc.). In some embodiments, the guard ring trace 136 is sunken in or recessed relative to the surface (e.g., the solder mask, etc.) of the PCB 104 (e.g., approximately twenty micrometers, etc.). In some embodiments, the guard ring trace 136 is configured (e.g., arranged, positioned, etc.) to receive flux and/or solder to couple the guard ring 108 to the PCB 104. In other embodiments, the guard ring trace 136 includes depressions or locations on the PCB 104 configured to receive adhesive and/or another coupling mechanism. The layout and/or configuration of the guard ring trace 136 may be different and arranged to suit the particular guard ring 108 or other perimeter component employed in the MEMS device 100. By way of example, the guard ring trace 136 may have a different shape and/or surround or encompass a different section or portion of the PCB 104. In other embodiments, the PCB 104 does not include the guard ring trace 136.

Figure 3:
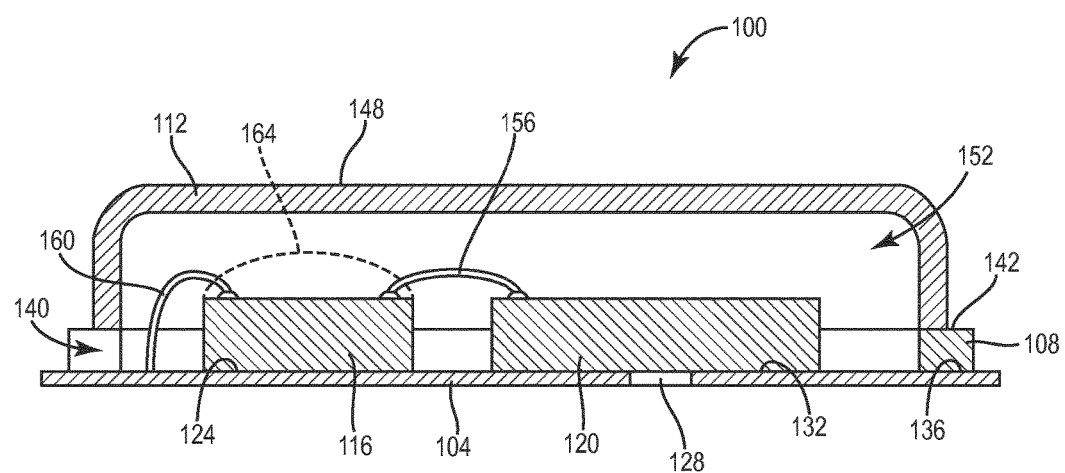
FIG. 3 is a cross-sectional view of the MEMS device of FIG. 1 taken along the line 3-3 in accordance with various implementations.

As shown in FIGS. 1-3, 6, and 7, the guard ring 108 is configured to couple to the guard ring trace 136 such that the guard ring 108 is positioned to extend around the periphery of the PCB 104. As shown in FIGS. 1, 2A, and 3, the guard ring 108 defines a vent, an aperture, and/or a cutout, shown as gap 140 (e.g., in embodiments where the MEMS microphone 120 is a non-pierced MEMS microphone, etc.). The guard ring 108 may thereby be a disconnected or discontinuous guard ring. In other embodiments, as shown in FIG. 2B, the guard ring 108 additionally or alternatively defines a notch, shown as semi-cutout 146 (e.g., in embodiments where the MEMS microphone 120 is a pierced MEMS microphone, etc.). The semi-cutout 146 may facilitate a tag (e.g., a non-meltable tag, etc.) in latching onto the can 112. In still other embodiments, the MEMS device 100 does not include the guard ring 108. In some embodiments, the guard ring 108 is formed of (e.g., manufactured from, etc.) a metal material (e.g., a ferrous metal, a non-ferrous metal, copper, steel, iron, silver, gold, aluminum, titanium, etc.). By way of example, the guard ring 108 may include a copper trace that is nickel and/or gold plated (e.g., gold plated over nickel plating, etc.). Such a metal guard ring 108 may be soldered to the guard ring trace 136. In other embodiments, the guard ring 108 may be formed of another material (e.g., a thermoplastic material, a ceramic material, etc.). In some embodiments, the guard ring 108 is adhered, fused, and/or otherwise coupled to the PCB 104 without the use of solder (e.g., adhesively coupled thereto, etc.). As shown in FIGS. 2A and 2B, the guard ring 108 includes a first coupling surface, shown as top surface 142. In one embodiment, the top surface 142 of the guard ring 108 includes a trace and/or is tinned such that the can 112 may be soldered to the top surface 142. In other embodiments, the top surface 142 is configured to receive adhesive and/or another coupling mechanism in order to couple the can 112 thereto. In another embodiment, the guard ring 108 is formed as a part of the PCB 104 and/or is embedded in the PCB 104. By way of example, the guard ring 108 may be a portion of the PCB 104 that extends upward from the PCB 104 and is configured to engage the can 112.

Figure 7:
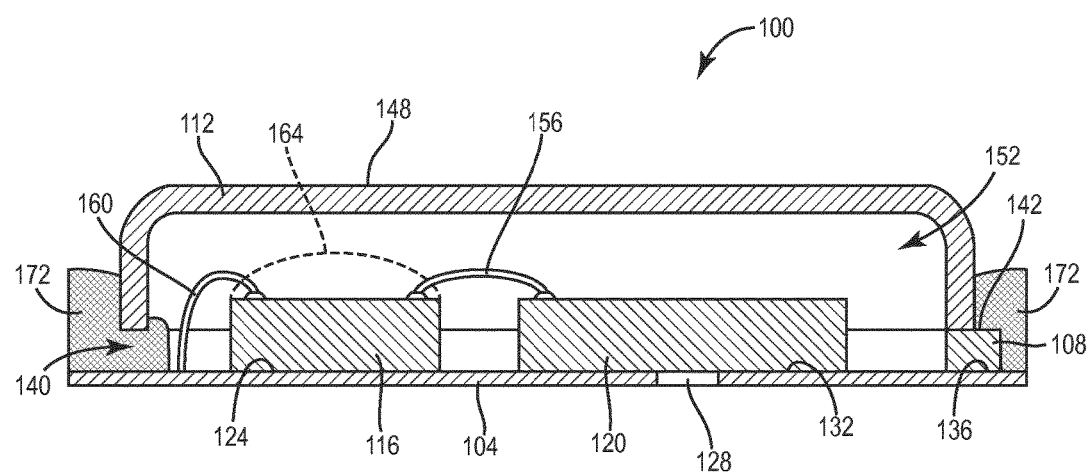
FIG. 7 is a cross-sectional view of the MEMS device of FIG. 6 taken along line 7-7 in accordance with various implementations.

As shown in FIG. 2A, the gap 140 is a break in the guard ring 108 having a width, shown as gap width 144. According to an exemplary embodiment, the gap width 144 is about 100 micrometers. In other embodiments, the gap width 144 is between about 50 micrometers and about 200 micrometers. In still other embodiments, the gap width 144 is between about 100 micrometers and about 250 micrometers. The thickness of the guard ring 108 may be between 10 micrometers and 100 micrometers. In some embodiments, the guard ring 108 has a thickness of about 20 micrometers to 40 micrometers. In some embodiments, the thickness of the guard ring is greater than 40 micrometers (e.g., 60, 80, 100 micrometers, etc.). The gap 140 may define a cross-sectional area that provides for fluid flow therethrough. According to an exemplary embodiment, the cross-sectional area of the gap 140 is about 9,000 square micrometers. In other embodiments, the cross-sectional area of the gap 140 is between about 1,00 square micrometers and about 15,000 square micrometers According to an exemplary embodiment, the can 112 is manufactured from a metal material (e.g., a ferrous material, a non-ferrous material, aluminum, titanium, steel, etc.). In other embodiments, the can 112 is manufactured from another material (e.g., a thermoplastic, a PCB, a ceramic, etc.). As shown in FIGS. 3 and 7, the can 112 is configured to couple to the top surface 142 of the guard ring 108 (e.g., with solder, an adhesive, etc.). As shown in FIGS. 2A, 2B, 3, and 7, the can 112 defines a continuous surface, shown as housing 148, sized to surround and enclose all the internal components of the MEMS device 100 (e.g., the ASIC 116, the MEMS microphone 120, etc.). In another embodiment, the guard ring 108 is formed as a part of the can 112 such that the gap 140 and/or the semi-cutout 146 are defined by the housing 148 of the can 112.

As shown in FIGS. 2A-3, and 7, the ASIC 116 is configured to couple, either by soldering, adhesion, or another coupling mechanism, to the ASIC traces 124 on the PCB 104. According to an exemplary embodiment, the ASIC 116 is arranged in electrical communication with the MEMS microphone 120. The ASIC 116 may be configured to modify signals produced by the MEMS microphone 120 and communicate them to an external device (e.g., an end-user device, etc.).

In one embodiment, the MEMS microphone 120 is and/or includes a non-pierced MEMS microphone. In another embodiment, the MEMS microphone 120 is and/or includes a pierced MEMS microphone. The MEMS microphone 120 may be configured to communicate a generated signal to the ASIC 116. The MEMS microphone 120 may be configured to couple to the microphone trace 132 on the PCB 104 either by soldering, adhesion, or another coupling mechanism.

As shown in FIGS. 3 and 7, the PCB 104, the guard ring 108, and the can 112 cooperatively define a back-cavity, shown as interior cavity 152. The gap 140 may provide fluid communication between the interior cavity 152 and an exterior environment (e.g., the ambient atmosphere, etc.). In some embodiments, the port 128 is at least partially isolated from the interior cavity 152 of the MEMS device 100 (e.g., completely isolated when the MEMS microphone 120 is a non-pierced MEMS microphone, partially isolated when the MEMS microphone 120 is a pierced MEMS microphone, etc.). By way of example, coupling the MEMS microphone 120 to the microphone trace 132 may provide a seal or an acoustic seal between the MEMS microphone 120 and the PCB 104 such that the port 128 is at least partially isolated and/or sealed relative to the interior cavity 152.

As shown in FIGS. 3 and 7, the MEMS microphone 120 is electrically coupled to the ASIC 116 with a first connector, shown as wire bond 156, and the ASIC 116 is electrically coupled to the PCB 104 with a second connector, shown as wire bond 160. In other embodiments, other connection types (e.g., other than wire bonding, etc.) may be utilized (e.g., Through Silicon Vias (TSV), flip chip also known as controlled collapse chip connection, etc.).

As shown in FIGS. 3 and 7, the ASIC 116 is encapsulated with a bond pad, shown as encapsulate 164. According to an exemplary embodiment, the encapsulate 164 includes an epoxy layer. Alternatively, the encapsulate 164 may be formed from and/or include a polymide or thermoplastic. In other embodiments, other portions of the MEMS device 100 may be encapsulated (e.g., the MEMS microphone 120, the PCB 104, etc.).

In some embodiments, the MEMS device 100 is assembled by applying flux and/or paste solder or a combined fluxing/soldering product to the ASIC traces 124, the microphone trace 132, the guard ring trace 136, and the top surface 142 of the guard ring 108 and placing the various components in their respective position. The MEMS device 100 may then be heat cycled to flow the solder and couple the components together. During this process, gases and evaporates may be formed causing a pressure increase within the interior cavity 152. The gases and evaporates or other pressure increase causing components are expelled from the interior cavity 152 through the gap 140, thereby preventing any pressure build-up. In other embodiments, adhesives or other coupling mechanisms are employed and the gap 140 provides pressure equalization between the interior cavity 152 and the external atmosphere.

Figure 4:
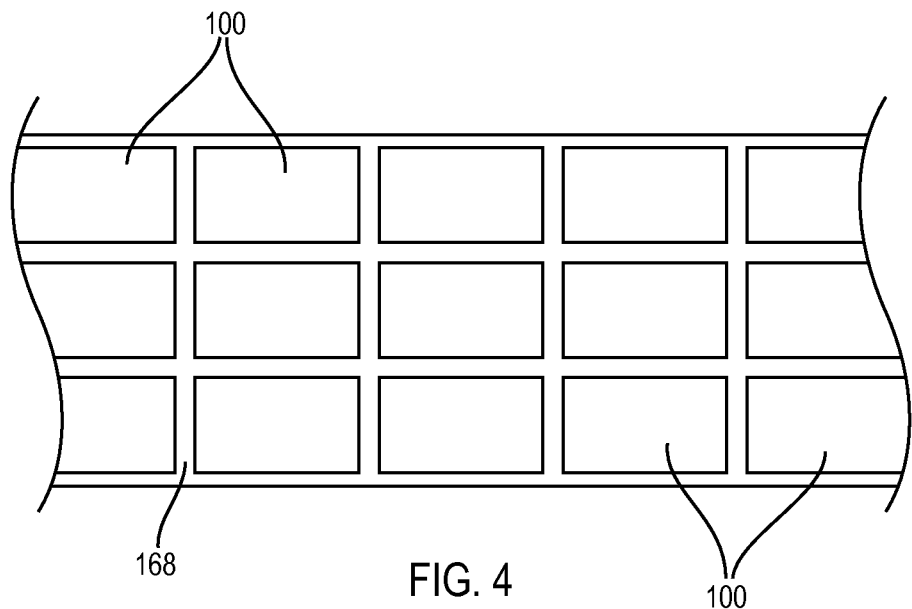
FIG. 4 is a top view of a populated PCB blank with a plurality of the MEMS devices of FIG. 1 in accordance with various implementations.

As shown in FIG. 4, during a production run of a plurality of MEMS devices 100, a substrate, shown as PCB blank 168, is used to form a large number of MEMS devices 100. Each of the MEMS devices 100 may be assembled, as discussed above, on the PCB blank 168.

Figure 5:
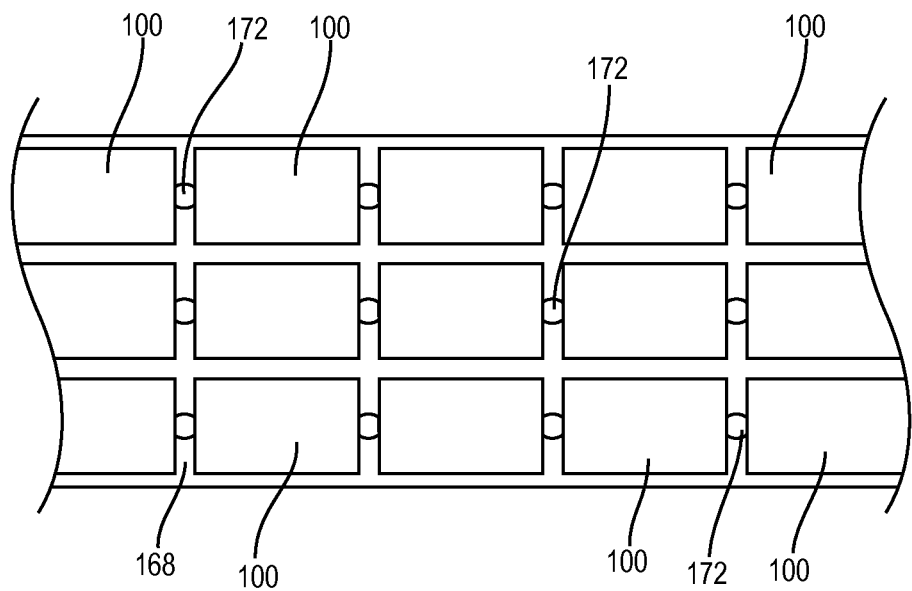
FIG. 5 is a top view of the populated PCB blank of FIG. 4 tagged with epoxy in accordance with various implementations.

As shown in FIG. 5, subsequent to assembly of the MEMS devices 100 as shown in FIG. 4, a non-meltable tag, shown as tag 172, is deposited onto or applied to the PCB blank 168 between adjacent MEMS devices 100. According to an exemplary embodiment, the tag 172 includes a non-meltable material. A non-meltable material may include any material capable of coupling the can 112 to the PCB 104 that does not melt and/or deform during subsequent reflows (i.e., has a higher melting point that the solder used in the MEMS device 100). In one embodiment, the non-meltable material is and/or includes an epoxy. The epoxy may include a non-conductive epoxy (e.g., a resin-based alumina-filled epoxy, a resin-based silica-filled epoxy, etc.) and/or a conductive epoxy (e.g., a resin-based silver-filled epoxy, a resin-based nickel-filled epoxy, etc.). In other embodiments, the non-meltable material includes another type of non-meltable material (e.g., other than an epoxy, etc.).

As shown in FIG. 5, the tags 172 are applied to a first or front end and an opposing second or rear end of each of the MEMS devices 100 such that the tags 172 are positioned along at least a portion of the periphery of the guard ring 108 and/or the can 112. In some embodiments, the tag 172 is applied around the entire periphery of the guard ring 108 and/or the can 112. The tag 172 may be applied to each of the MEMS devices 100 on the PCB blank 168 such that the gaps 140 and/or the semi-cutouts 146 of the MEMS devices 100 are filled and/or effectively sealed while also coupling the guard ring 108 and/or the can 112 to the PCB blank 168 (i.e., the PCB 104). By way of example, a tag 172 may be deposited between two successive MEMS devices 100 such that a single tag 172 encloses and seals the gap 140 of one of the MEMS devices 100 and further secures the can 112 and/or the guard ring 108 of both MEMS devices 100 to the PCB blank 168. The non-meltable material of the tag 172 may have a melting point above about 240 degrees Celsius. In other embodiments, the non-meltable material of the tags 172 has a melting point above about 260 degrees Celsius. In some embodiments, the non-meltable material of the tag 172 may be selected from thermoplastics, epoxies, polymides, adhesives, etc. In this application, a non-meltable material may be a material that does not melt during a reflow heat cycle and/or that has a melting point greater than solder.

Figure 6:
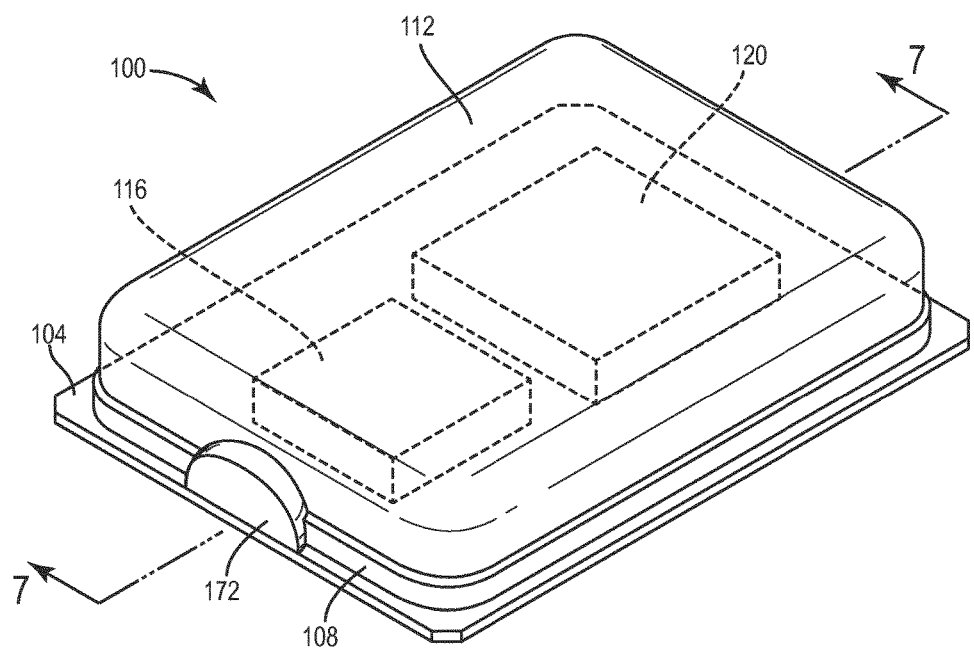
FIG. 6 is a perspective view of a MEMS device singulated from the PCB blank of FIG. 5 in accordance with various implementations.

According to an exemplary embodiment, a dicing, separating, and/or singulation operation is performed on the PCB blank 168 to form individual MEMS devices 100 after the tags 172 are cured and/or set. As shown in FIGS. 6 and 7, each resulting individual MEMS device 100 includes a first tag 172 positioned to seal the gap 140 thereof, thereby effectively isolating the interior cavity 152 from the exterior atmosphere. The first tag 172 may also maintain or secure the guard ring 108 and the can 112 in position on the PCB 104. As shown in FIG. 7, each resulting individual MEMS device 100 includes a second tag 172 positioned on the side of the MEMS device 100 opposite the gap 140. The second tag 172 may be configured to maintain or secure the guard ring 108 and/or the can 112 in position on the PCB 104. In some embodiments, the MEMS devices 100 include additional tags 172 variously positioned about the periphery the can 112 and/or the guard ring 108 (e.g., on all four sides, around the entire periphery, along the length of one or more sides of the MEMS device 100, etc.).

The above embodiments may provide various advantageous over traditional MEMS microphone packaging. Traditionally, the components of MEMS devices are only coupled to a substrate using solder. Therefore, the can of such traditional MEMS devices have a tendency to tilt or otherwise deform or become askew when the MEMS device is installed or reflowed into a larger system (e.g., an end-user device, etc.). By way of example, the solder typically holding the can to the PCB melts, thereby causing the solder to reflow while installing the MEMS device into the larger device. Any appreciable tilt on the can 112 may cause geometric defects and lead to reduced performance of the MEMS device. The MEMS device 100 of the present disclosure prevents such tilting by providing a gap 140 that allows pressure to escape the interior cavity 152 during initial formation or installation, then the MEMS device 100 is sealed and secured with the tags 172. The tags 172 include a material that is selected to have a melting temperature above the melting temperature of the solder used such that the tags 172 do not melt during reflow or installation into the larger system. The tags 172 maintain or secure the can 112 and the guard ring 108 of the MEMS device 100 in position and inhibit geometric deformation (e.g., can tilting, etc.). The embodiments discussed above may also be applied to top port MEMS devices as well as bottom port MEMS devices.

Figure 8:
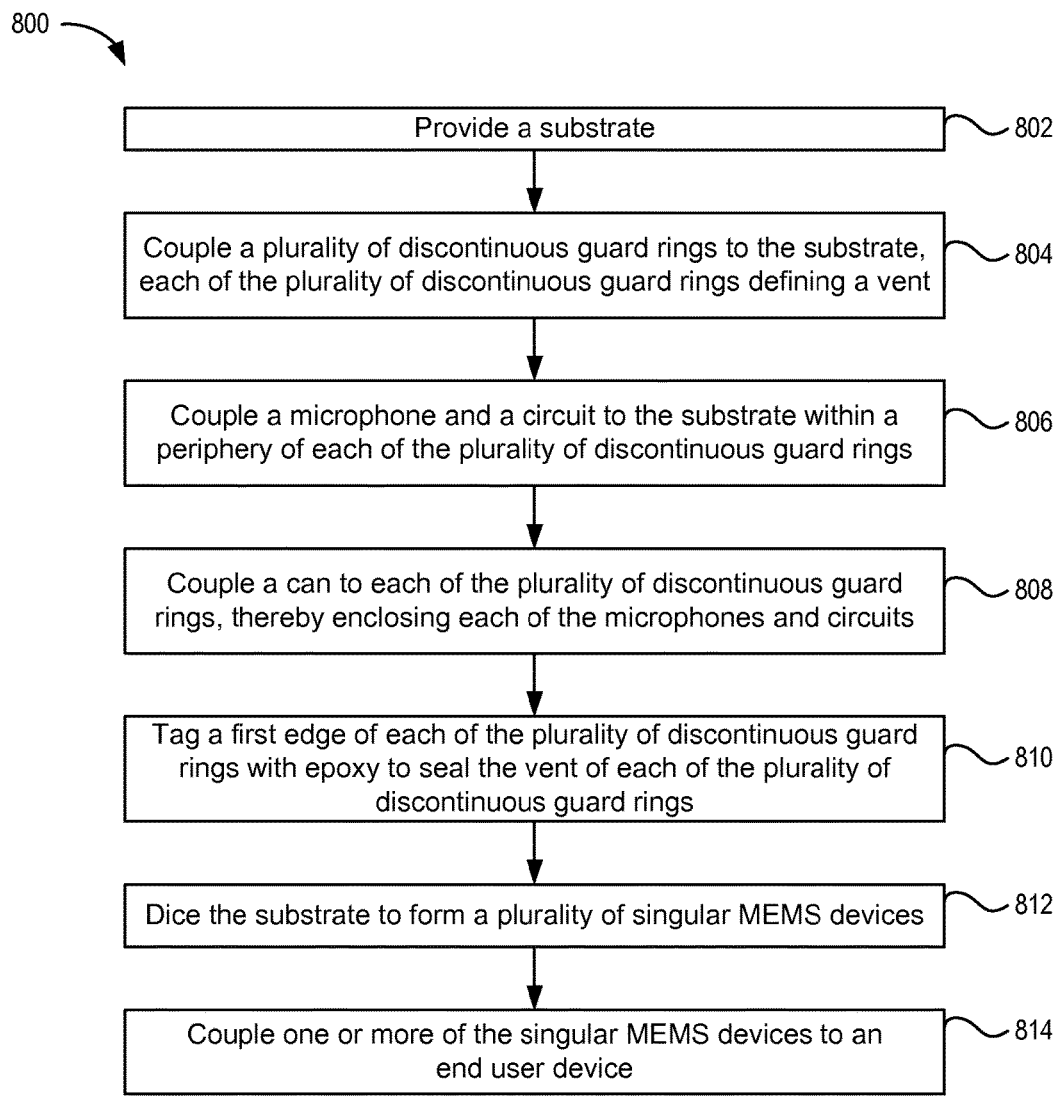
FIG. 8 is a flow diagram of a method for manufacturing a MEMS device to prevent tilting of a can thereof in accordance with various implementations.

Referring now to FIG. 8, a method 800 for manufacturing a MEMS device to prevent tilting of a can thereof is shown according to an example embodiment. Method 800 may be implemented with the MEMS device 100 of FIGS. 1-7. Accordingly, method 800 may be described with regards to FIGS. 1-7.

At step 802, a substrate (e.g., the PCB blank 168, etc.) is provided. The substrate may define a plurality of ports (e.g., the ports 128, etc.). At step 804, a plurality of discontinuous guard rings (e.g., the guard rings 108, etc.) are coupled to the substrate. According to an exemplary embodiment, each of the plurality of guard rings defines a vent (e.g., the gap 140, a pressure release aperture, etc.). In one embodiment, the plurality of discontinuous guard rings are coupled to the substrate with an adhesive. In other embodiments, the plurality of discontinuous guard rings are coupled to the substrate with solder. In an alternative embodiment, the guard rings do not define vents, but rather a semi-cutout. In still other alternative embodiments, the guard rings are not coupled to the substrate (e.g., the semi-cutout 146, etc.). At step 806, a MEMS component such as a microphone (e.g., the MEMS microphone 120, a pierced MEMS microphone, a non-pierced MEMS microphone, etc.) and a circuit (e.g., the ASIC 116, etc.) are coupled to the substrate within the periphery each of the plurality of discontinuous guard rings. According to an exemplary embodiment, each of the microphones is positioned to at least partially isolate one of the ports defined by the substrate.

At step 808, a lid or can (e.g., the can 112, etc.) is coupled to each of the plurality of discontinuous guard rings, thereby enclosing the microphones and the circuits. In one embodiment, each of the cans is coupled to the plurality of discontinuous guard rings with solder. In other embodiments, each of the cans is coupled to the plurality of discontinuous guard rings with an adhesive. According to an exemplary embodiment, the vent is configured to facilitate relieving pressure from within an interior cavity (e.g., the interior cavity 152, etc.) defined between the substrate and the cans as each of the cans is coupled to the plurality of discontinuous guard rings. At step 810, a first edge (e.g., a front edge, etc.) of each of the plurality of discontinuous guard rings is tagged with epoxy. According to an exemplary embodiment, the epoxy is positioned to seal the vent of each of the plurality of discontinuous guard rings and/or secure the can and/or the discontinuous guard ring to the substrate. The epoxy tagged on the front edge of a respective MEMS device may additionally tag an opposing second edge (e.g., a rear edge, etc.) of an adjacent (e.g., a subsequent, a successive, a prior, etc.) MEMS device positioned on the substrate.

At step 812, the substrate is singulated (e.g., diced), thereby forming (e.g., separating, etc.) a plurality of singular (e.g., individual, etc.) MEMS devices. At step 814, the singular MEMS devices are coupled to an end-user device (e.g., a smartphone, a tablet, a laptop, etc.). During the such coupling, the epoxy coupling the first edge and/or the second edge of the can and the guard ring to the substrate may prevent the can from tilting and/or otherwise deforming as solder of the MEMS device reflows. Such tilting may be prevented due to the epoxy having a higher melting point that the solder of the MEMS device.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system (MEMS) device, comprising:
   a substrate defining a port;
   a cap coupled to the substrate such that the substrate and the cap cooperatively define an interior cavity;
   a microelectromechanical component disposed within the interior cavity and coupled to the substrate such that the microelectromechanical component is positioned over the port to at least partially isolate the port from the interior cavity; and a non-continuous tag coupled to the substrate and the cap, wherein the non-continuous tag is positioned at one or more discrete locations along a periphery of the cap to secure the cap to the substrate.

2. The MEMS device of claim 1, further comprising a guard ring coupled between the substrate and the cap.

3. The MEMS device of claim 2, wherein the guard ring defines at least one of an aperture or a semi-cutout.

4. The MEMS device of claim 3, wherein the guard ring defines the aperture, and wherein the non-continuous tag is positioned to seal the aperture of the guard ring.

5. The MEMS device of claim 4, wherein the microelectromechanical component includes a non-pierced microphone.

6. The MEMS device of claim 3, wherein the guard ring defines the semi-cutout, and wherein the non-continuous tag is positioned to latch onto the semi-cutout to secure the cap to the substrate.

7. The MEMS device of claim 6, wherein the microelectromechanical component includes a pierced microphone.

8. The MEMS device of claim 3, further comprising a second non-continuous tag coupled on a side of the guard ring opposite the at least one of the aperture or the semi-cutout, the second non-continuous tag further securing the cap to the substrate.

9. The MEMS device of claim 2, wherein at least one of (i) the guard ring is coupled to the substrate with solder or (ii) the cap is coupled to the guard ring with solder.

10. The MEMS device of claim 9, wherein a material of the non-continuous tag has a higher melting point than the solder thereby inhibiting movement of the cap during a reflow process.

11. A method of manufacturing a microelectromechanical system (MEMS) device, comprising:

providing a substrate blank defining a plurality of apertures;

coupling a plurality of guard rings to the substrate blank such that each of the plurality of guard rings is positioned to surround a respective one of the plurality of apertures, wherein each of the plurality of guard rings defines at least one of a vent or a semi-cutout;

coupling a plurality of microelectromechanical components to the substrate blank, each of the plurality of microelectromechanical components positioned within a periphery of a respective guard ring and at least partially isolating a respective one of the plurality of apertures;

coupling a plurality of caps onto the plurality of guard rings, each of the plurality of caps coupled to a respective one of the plurality of guard rings;

applying a plurality of tags to seal each vent or semi-cutout and secure each set of guard rings and caps to the substrate blank; and singulating each set of guard rings and caps from the substrate blank to form a plurality of individual MEMS devices.

12. The method of claim 11, wherein each of the plurality of guard rings includes a first edge and an opposing second edge, the at least one of the vent or the semi-cutout defined by the second edge, and wherein applying the plurality of tags includes applying each of the plurality of tags between the first edge of a first guard ring and the second edge of a second, adjacent guard ring such that the first edge of the first guard ring and the second edge of the second, adjacent guard ring are coupled to the substrate blank by a single tag.

13. The method of claim 11, wherein at least one of (i) the plurality of guard rings are coupled to the substrate blank with solder or (ii) the plurality of caps are coupled to the plurality of guard rings with solder.

14. The method of claim 13, wherein the plurality of tags include a material having a higher melting point than the solder.

15. The method of claim 11, wherein at least one of coupling the plurality of guard rings to the substrate blank, coupling the plurality of microelectromechanical components to the substrate blank, or coupling the plurality of caps onto the plurality of guard rings increases a pressure within an interior cavity of each of the plurality of individual MEMS devices, and wherein the vent is positioned to relieve the pressure within the interior cavity prior to the plurality of tags being applied.

16. A populated printed-circuit-board (PCB) blank, comprising:

a substrate blank defining a plurality of substrate apertures;

a plurality of microelectromechanical devices positioned on the substrate blank, each of the plurality of microelectromechanical devices including:

a guard ring coupled to the substrate blank, the guard ring having a first edge and an opposing second edge defining at least one of a vent aperture or a semi-cutout;

a lid coupled to the guard ring, wherein the substrate blank, the guard ring, and the lid cooperatively define an interior cavity; and a microelectromechanical component coupled to the substrate blank over a respective substrate aperture to at least partially isolate the respective substrate aperture from the interior cavity; and a plurality of tags, each of the plurality of tags positioned between adjacent microelectromechanical devices such that (i) the first edge and the second edge of each guard ring are secured to the substrate blank (ii) and each of the at least one of the vent aperture or the semi-cutout is sealed.

17. The populated PCB blank of claim 16, wherein one of the plurality of tags is positioned between each pair of adjacent microelectromechanical devices.

18. The populated PCB blank of claim 16, wherein each of the plurality of tags includes a non-meltable material.

19. The populated PCB blank of claim 16, wherein each of the plurality of microelectromechanical components includes a microphone.

20. The populated PCB blank of claim 16, wherein each of the plurality of tags inhibits each lid from moving.

* * * * *